(12) United States Patent
Ishihara

(10) Patent No.: US 10,033,394 B2
(45) Date of Patent: Jul. 24, 2018

(54) ATOM CELL, METHOD OF MANUFACTURING ATOM CELL, QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Naoki Ishihara, Chino (JP)

(73) Assignee: Seiko Epson Corporation (JP)

( * ) Notice: Subject to any disclaimer, the term of this patent is extended or adjusted under 35 U.S.C. 154(b) by 15 days.

(21) Appl. No.: 15/097,659

(22) Filed: Apr. 13, 2016

(65) Prior Publication Data

US 2016/0308543 A1 Oct. 20, 2016

(30) Foreign Application Priority Data

Apr. 15, 2015 (JP) ................. 2015-083450

(51) Int. Cl.
*H03L 7/26* (2006.01)
*G04F 5/14* (2006.01)
*H03B 17/00* (2006.01)
*H01S 1/06* (2006.01)

(52) U.S. Cl.
CPC ................. *H03L 7/26* (2013.01); *G04F 5/14* (2013.01); *G04F 5/145* (2013.01); *H01S 1/06* (2013.01); *H03B 17/00* (2013.01)

(58) Field of Classification Search
CPC ... H03B 17/00; H03L 7/26; G04F 5/14; G04F 5/145; H01S 1/06

USPC ..................................... 331/3, 94.1
See application file for complete search history.

(56) References Cited

U.S. PATENT DOCUMENTS

| 8,067,991 B2 | 11/2011 | Youngner et al. | |
|---|---|---|---|
| 8,218,590 B2 | 7/2012 | Youngner et al. | |
| 8,242,851 B2 | 8/2012 | Youngner et al. | |
| 8,299,860 B2 | 10/2012 | Youngner et al. | |
| 8,941,442 B2 | 1/2015 | Youngner et al. | |
| 8,970,309 B2 | 3/2015 | Sato et al. | |
| 9,146,540 B2 | 9/2015 | Youngner et al. | |
| 9,151,808 B2* | 10/2015 | Nagasaka ............ | G01R 33/032 |
| 2010/0104450 A1 | 4/2010 | Longoni et al. | |
| 2011/0187464 A1 | 8/2011 | Youngner et al. | |
| 2014/0232479 A1* | 8/2014 | Maki ........................ | H01S 1/06 |
| | | | 331/94.1 |

FOREIGN PATENT DOCUMENTS

| JP | 2009-283526 A | 12/2009 |
|---|---|---|
| JP | 2010-519017 A | 6/2010 |
| JP | 2012-013671 A | 1/2012 |
| JP | 2013-007720 A | 1/2013 |
| JP | 2013-038382 A | 2/2013 |
| JP | 2014-110464 A | 6/2014 |
| WO | WO-2008-099256 A1 | 8/2008 |

* cited by examiner

*Primary Examiner* — Arnold Kinkead
(74) *Attorney, Agent, or Firm* — Harness, Dickey & Pierce, P.L.C.

(57) ABSTRACT

An atom cell is provided with an internal space including a space formed of a through hole housing gaseous alkali metal, a space formed of a through hole housing a compound as an alkali metal emission material, and a space formed of a through hole housing liquid or solid alkali metal.

22 Claims, 12 Drawing Sheets

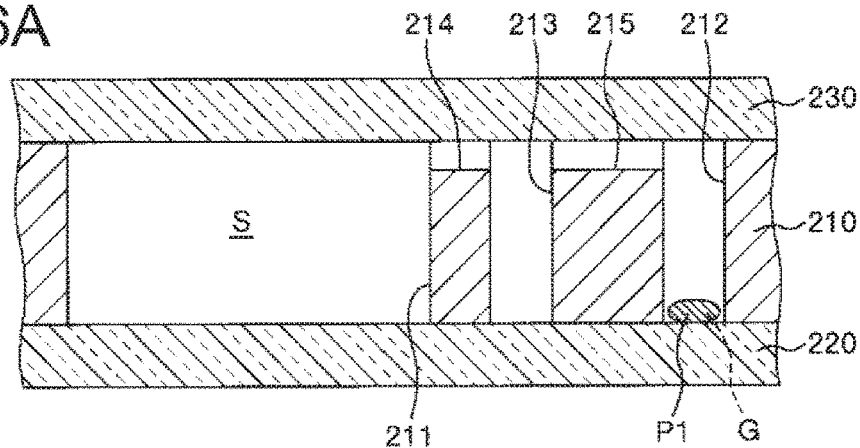
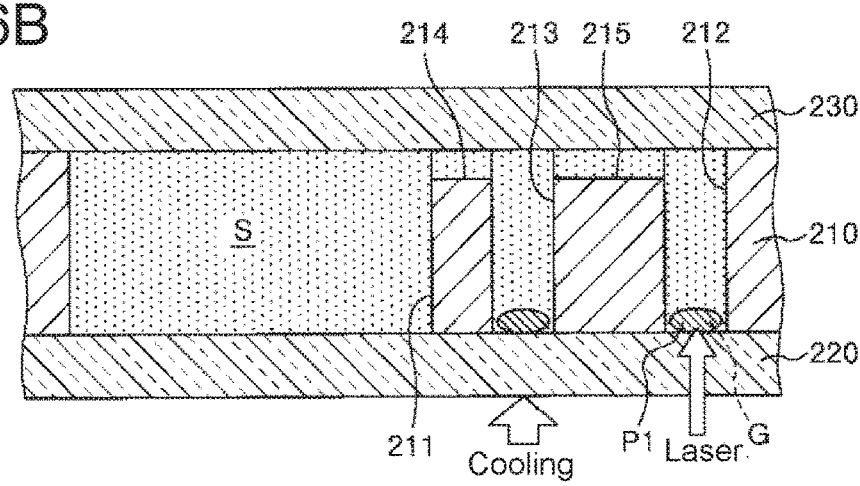
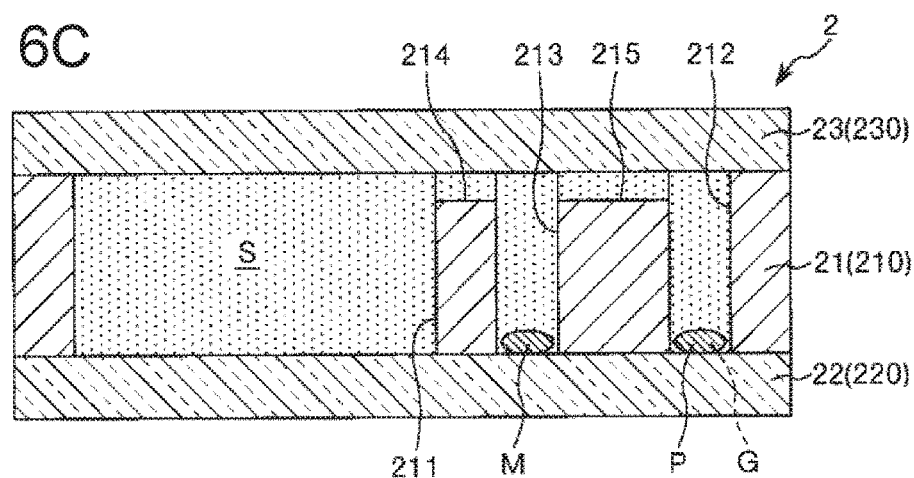

ATOM CELL, METHOD OF MANUFACTURING ATOM CELL, QUANTUM INTERFERENCE DEVICE, ATOMIC OSCILLATOR, ELECTRONIC APPARATUS, AND MOVING OBJECT

CROSS REFERENCE

This application claims the benefit of Japanese Application No. JP 2015-083450, filed on Apr. 15, 2015. The disclosure of the prior application is hereby incorporated by reference herein in its entirety.

BACKGROUND

1. Technical Field

The present invention relates to an atom cell, a method of manufacturing an atom cell, a quantum interference device, an atomic oscillator, an electronic apparatus, and a moving object.

2. Related Art

As an oscillator having long-term accurate oscillation characteristics, there has been known an atomic oscillator, which oscillates based on the energy transition of an atom of alkali metal such as rubidium or cesium.

In general, the operation principles of atomic oscillators are roughly classified into a system using a double resonance phenomenon by light and microwave, and a system using the quantum interference effect (coherent population trapping (CPT)) due to two types of light different in wavelength from each other. Both of the atomic oscillators are generally provided with an atom cell (gas cell) having alkali metal encapsulated.

As a method of manufacturing such an atom cell, there has been known a method of sealing a hollow section housing a compound including the alkali metal, and then heating to react the compound to thereby generate an alkali metal gas inside the hollow section as disclosed in JP-A-2013-007720 (Document 1). According to such a method, an unwanted gas in the hollow section can be reduced.

However, in the gas cell obtained by the method described in Document 1, there is a problem that an amount of alkali metal gas in the hollow section sealed decreases with time, and as a result, the frequency stability degrades.

SUMMARY

An advantage of the invention is to provide an atom cell and a method of manufacturing the atom cell, and further provide a quantum interference device, an atomic oscillator, an electronic apparatus, and a moving object each equipped with such an atom cell.

The invention is implemented as the following aspects or application examples.

APPLICATION EXAMPLE 1

An atom cell according to this application example of the invention includes alkali metal atoms, an alkali metal emission material having emitted the alkali metal atoms, and an internal space housing the alkali metal atoms and the alkali metal emission material, the internal space includes a first region housing the alkali metal atoms in a form of a gas, a second region housing the alkali metal emission material, and a third region housing the alkali metal atoms in a form of one of a liquid and a solid.

According to such an atom cell, since the liquid or solid alkali metal atoms exist in the third region of the internal space as an excess, it is possible to reduce chances for the amount (the partial pressure) of the gaseous alkali metal atoms existing in the first region of the internal space sealed to decrease. Therefore, it is possible to realize the excellent frequency stability for a long period of time.

APPLICATION EXAMPLE 2

In the atom cell according to the application example of the invention, it is preferable that the third region is located between the first region and the second region.

According to this application example of the invention, even if the second region is removed, the first region and the third region can be made to be communicated with each other, and thus, it is possible to reduce the chances for the amount of the gaseous alkali metal atoms located in the first region to decrease.

APPLICATION EXAMPLE 3

In the atom cell according to the application example of the invention, it is preferable that the first region is located between the second region and the third region.

According to this application example of the invention, when heating the second region to emit the alkali metal atoms from the alkali metal emission material, the temperature of the third region can easily be set to a level lower than the temperature of the second region. Therefore, the liquid or solid alkali metal atoms can easily be housed in the third region.

APPLICATION EXAMPLE 4

In the atom cell according to the application example of the invention, it is preferable that there is further included a communication hole communicating the first region and the second region with each other, and a width of the communication hole is smaller than a width of the alkali metal emission material.

According to this application example of the invention, it is possible to reduce the chances for the alkali metal emission material to move from the second region to the first region.

APPLICATION EXAMPLE 5

In the atom cell according to the application example of the invention, it is preferable that there is further included a getter material disposed in the second region.

According to this application example of the invention, it is possible to make the getter material adsorb the unwanted gas existing in the internal space to make the characteristics of the atom cell excellent.

APPLICATION EXAMPLE 6

In the atom cell according to the application example of the invention, it is preferable that partial pressure of a gas other than the gaseous alkali metal atoms in the internal space is one of equal to and lower than $10^{-4}$ Pa.

Such an atom cell small in the amount of unwanted gas has excellent characteristics.

APPLICATION EXAMPLE 7

A method of manufacturing an atom cell according to this application example of the invention includes preparing a cell container having an internal space including a first region, a second region, and a third region, and housing a solid compound including alkali metal in the second region of the internal space, heating the second region to emit the alkali metal from the compound, and adjusting a temperature of the third region to a level lower than a temperature of the first region.

According to such a method of manufacturing an atom cell, it is possible to obtain the atom cell having the liquid or solid alkali metal atoms existing in the third region of the internal space as an excess. According to the atom cell thus obtained, it is possible to prevent the amount (the partial pressure) of the gaseous alkali metal atoms located in the first region of the internal space sealed from decreasing, and thus the excellent frequency stability can be realized for a long period of time.

APPLICATION EXAMPLE 8

In the method of manufacturing an atom cell according to the application example of the invention, it is preferable that the preparing includes sealing the internal space.

According to this application example of the invention, the amount of unwanted gas in the internal space of the atom cell obtained can be reduced.

APPLICATION EXAMPLE 9

In the method of manufacturing an atom cell according to the application example of the invention, it is preferable that there is further included removing the second region after the heating for emitting.

According to this application example of the invention, the compound having emitted the alkali metal can be eliminated in the atom cell obtained, and it is possible to reduce the influence of the compound to enhance the frequency stability.

APPLICATION EXAMPLE 10

In the method of manufacturing an atom cell according to the application example of the invention, it is preferable that the removing is performed after the adjusting.

According to this application example of the invention, the compound having been emitted the alkali metal can be eliminated in the atom cell obtained.

APPLICATION EXAMPLE 11

In the method of manufacturing an atom cell according to the application example of the invention, it is preferable that in the preparing, the first region and the second region are communicated with each other via a communication hole, and the removing includes blocking the communication hole.

According to this application example of the invention, the internal space from which the second region has been removed can easily be sealed.

APPLICATION EXAMPLE 12

In the method of manufacturing an atom cell according to the application example of the invention, it is preferable that in the preparing, a plurality of the cell containers is connected to one another.

According to this application example of the invention, the plurality of atom cells can efficiently be manufactured.

APPLICATION EXAMPLE 13

A quantum interference device according to this application example of the invention includes the atom cell according to the application example of the invention.

With the quantum interference device according to this application example of the invention, the excellent frequency stability can be exerted.

APPLICATION EXAMPLE 14

In the quantum interference device according to the application example of the invention it is preferable that the first region is higher in temperature than the third region.

According to this application example of the invention, it is possible to make the gaseous alkali metal atoms and the liquid or solid alkali metal stably exist in the first region and the third region, respectively.

APPLICATION EXAMPLE 15

An atomic oscillator according to this application example of the invention includes the atom cell according to the application example of the invention.

With the atomic oscillator according to this application example of the invention, the excellent frequency stability can be exerted.

APPLICATION EXAMPLE 16

An electronic apparatus according to this application example of the invention includes the atom cell according to the application example of the invention.

With the electronic apparatus according to this application example of the invention, the frequency stability of the atom cell can be made excellent.

APPLICATION EXAMPLE 17

A moving object according to this application example of the invention includes the atom cell according to the application example of the invention.

With the moving object according to this application example of the invention, the frequency stability of the atom cell can be made excellent.

BRIEF DESCRIPTION OF THE DRAWINGS

The invention will be described with reference to the accompanying drawings, wherein like numbers reference like elements.

FIGS. 6A through 6C are diagrams for describing the preparatory process, an emission process, a temperature adjustment process, and a segmenting process in the method of manufacturing the atom cell shown in FIGS. 4A and 4B.

DESCRIPTION OF EXEMPLARY EMBODIMENTS

Hereinafter, an atom cell, a method of manufacturing the atom cell, a quantum interference device, an atomic oscillator, an electronic apparatus, and a moving object according to the invention will be described in detail based on the embodiments shown in the accompanying drawings.

1. An Atomic Oscillator (Quantum Interference Device)

Firstly, the atomic oscillator (atomic oscillator equipped with the atom cell according to the invention) according to the invention will be described. It should be noted that although an example of applying the quantum interference device according to the invention to the atomic oscillator will hereinafter be described, the quantum interference device according to the invention can be applied not only to the atomic oscillator, but also to, for example, a magnetic sensor or a quantum memory.

First Embodiment

Figure 1:
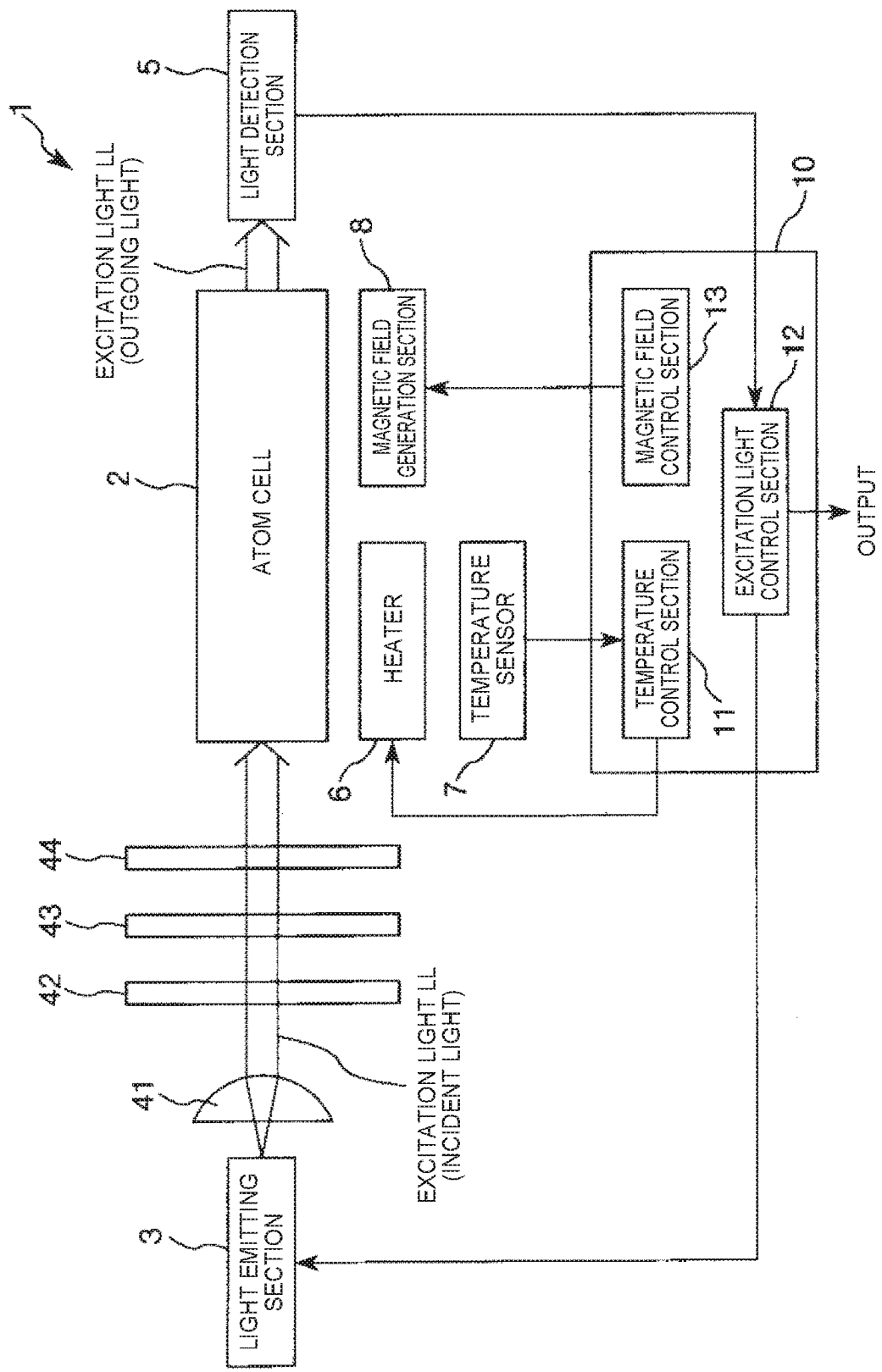
FIG. 1 is a schematic diagram showing an atomic oscillator (a quantum interference device) according to a first embodiment of the invention.
Figure 2:
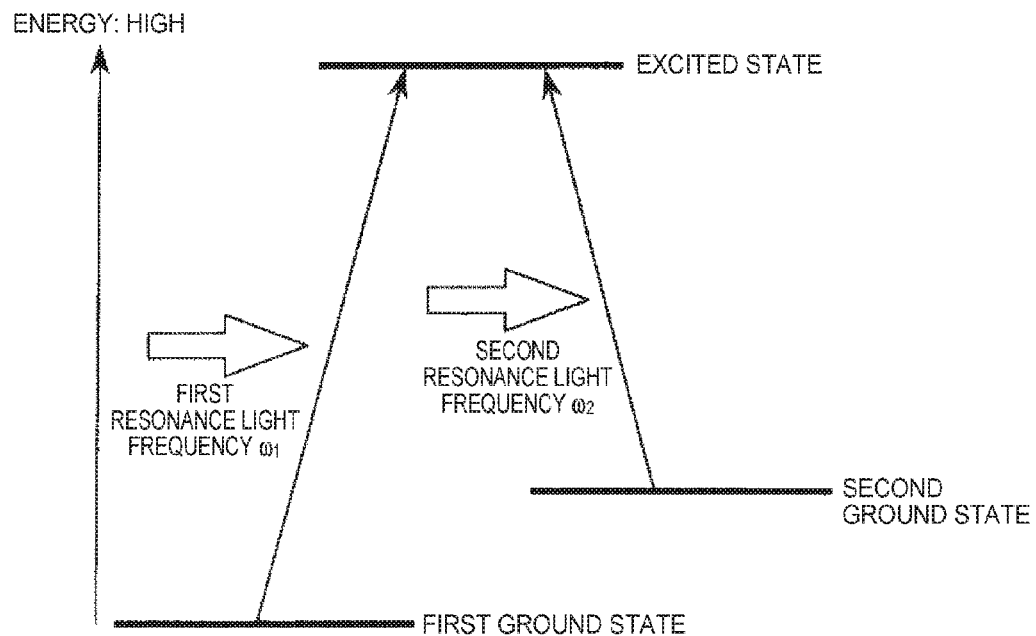
FIG. 2 is a diagram for describing the energy state of alkali metal.
Figure 3:
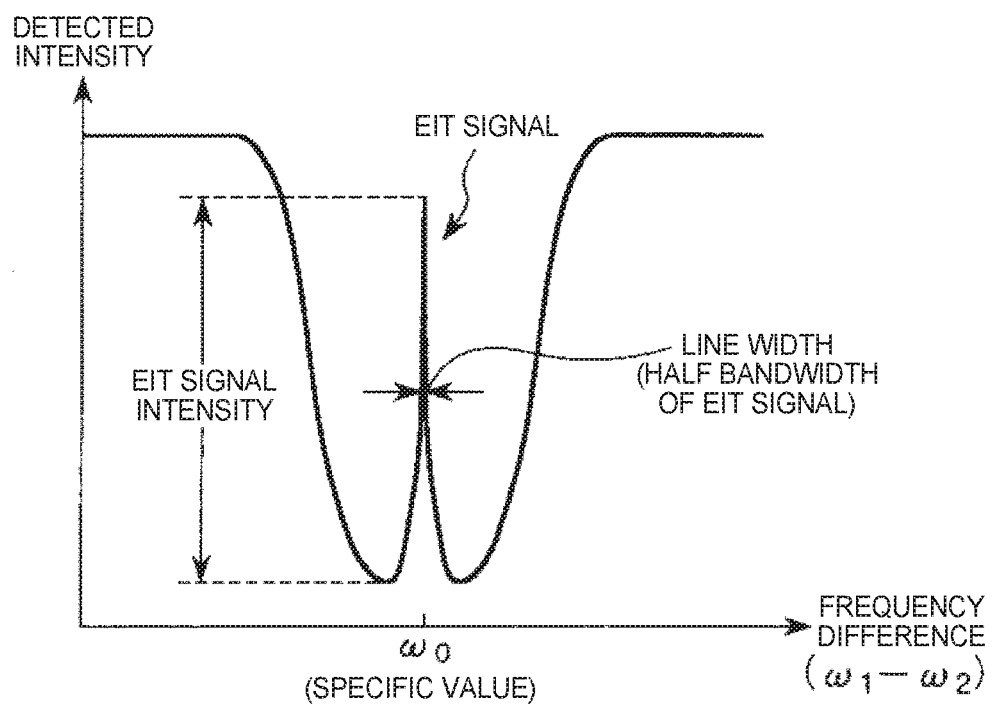
FIG. 3 is a graph showing a relationship between a difference in frequency between two types of light emitted from a light emitting section, and the intensity of the light detected in a light detection section.

FIG. 1 is a schematic diagram showing the atomic oscillator (quantum interference device) according to a first embodiment of the invention. Further, FIG. 2 is a diagram for describing the energy state of alkali metal, and FIG. 3 is a graph showing a relationship between a difference in frequency between two types of light emitted from a light emitting section, and the intensity of the light detected in a light detection section.

The atomic oscillator 1 shown in FIG. 1 is an atomic oscillator using coherent population trapping. As shown in FIG. 1, the atomic oscillator 1 is provided with an atom cell 2 (a gas cell), a light emitting section 3, optical components 41, 42, 43, and 44, a light detection section 5, a heater 6, a temperature sensor 7, a magnetic field generation section 8, and a control section 10.

Firstly, the principle of the atomic oscillator 1 will briefly be described.

As shown in FIG. 1, in the atomic oscillator 1, the light emitting section 3 emits excitation light LL toward the atom cell 2, and the light detection section 5 detects the excitation light LL having been transmitted through the atom cell 2.

In the atom cell 2, there is encapsulated gaseous alkali metal (metal atoms), and as shown in FIG. 2, the alkali metal has energy levels in the three-level system, and can take three states, namely two ground states (first and second ground states) different in energy level and an excited state. Here, the first ground state is an energy state lower than the second ground state.

The excitation light LL having been emitted from the light emitting section 3 includes two types of resonance light, namely first and second resonance light, different in frequency, and when irradiating the gaseous alkali metal described above with the two types of resonance light, namely the first resonance light and the second resonance light, the light absorptance (the light transmittance) of the first and second resonance light in the alkali metal varies in accordance with a difference ($\omega_1-\omega_2$) between the frequency $\omega_1$ of the first resonance light and the frequency $\omega_2$ of the second resonance light.

Then, when the difference ($\omega_1-\omega_2$) between the frequency $\omega_1$ of the first resonance light and the frequency $\omega_2$ of the second resonance light coincides with the frequency corresponding to the energy difference between the first ground state and the second ground state, the excitation from the first and second ground states to the excited state stops, respectively. On this occasion, both of the first resonance light and the second resonance light are transmitted without being absorbed by the alkali metal. Such a phenomenon is called a CPT phenomenon or electromagnetically induced transparency (EIT).

For example, in the case in which the light emitting section 3 fixes the frequency $\omega_1$ of the first resonance light and varies the frequency $\omega_2$ of the second resonance light, the detection intensity of the light detection section 5 rapidly rises as shown in FIG. 3 when the difference ($\omega_1-\omega_2$) between the frequency $\omega_1$ of the first resonance light and the frequency $\omega_2$ of the second resonance light coincides with the frequency $\omega_0$ corresponding to the energy difference between the first ground state and the second ground state. Such a rapid signal as described above is detected as an EIT signal. The EIT signal has a characteristic value determined by the type of the alkali metal. Therefore, by using such an EIT signal, an oscillator can be configured.

Hereinafter, constituents of the atomic oscillator 1 will briefly be described.

Atom Cell

In the atom cell 2, there is encapsulated the alkali metal such as rubidium, cesium, or sodium in the form of a gas. Further, in the atom cell 2, there can also be encapsulated a noble gas such as argon or neon, or an inert gas such as nitrogen as a buffer gas together with the alkali metal gas if needed.

Further, in the atom cell 2, there are disposed an alkali metal compound, a getter material, and so on besides the above. It should be noted that this point will be described later in detail together with the configuration of the atom cell 2.

Light Emitting Section

The light emitting section 3 (a light source) has a function of emitting the excitation light LL for exciting the alkali metal atoms in the atom cell 2.

More specifically, the light emitting section 3 is for emitting the two types of light (the first resonance light and the second resonance light) different in frequency from each other as described above as the excitation light LL. The first resonance light is the light which can excite (resonate) the alkali metal located inside the atom cell 2 from the first ground state described above to the excited state. In contrast, the second resonance light is the light which can excite (resonate) the alkali metal located inside the atom cell 2 from the second ground state described above to the excited state.

The light emitting section 3 is not particularly limited providing such excitation light as described above can be emitted, and for example, a semiconductor laser such as a vertical cavity surface emitting laser (VCSEL) can be used as the light emitting section 3.

It should be noted that the light emitting section 3 is adjusted in temperature to a predetermined temperature using a temperature control element (e.g., a heating resistive element and a Peltier element) not shown.

Optical Components

The plurality of optical components 41, 42, 43, and 44 is disposed on a light path of the excitation light LL between the light emitting section 3 described above and the atom cell 2. Here, the optical component 41, the optical component 42, the optical component 43, and the optical component 44 are arranged in this order from the light emitting section 3 side to the atom cell 2 side.

The optical component 41 is a lens. Thus, the atom cell 2 can be irradiated with the excitation light LL with no waste.

Further, the optical component 41 has a function of changing the excitation light LL to parallel light. Thus, it is possible to easily and reliably prevent the excitation light LL from being reflected by an inside wall of the atom cell 2. Therefore, it is possible to preferably generate the resonance of the excitation light inside the atom cell 2, and as a result, improve the oscillation characteristics of the atomic oscillator 1.

The optical component 42 is a polarization plate. Thus, it is possible to adjust the polarization direction of the excitation light LL from the light emitting section 3 to a predetermined direction.

The optical component 43 is a neutral density filter (ND filter). Thus, it is possible to adjust (decrease) the intensity of the excitation light LL entering the atom cell 2. Therefore, even in the case in which the output of the light emitting section 3 is high, it is possible to set the intensity of the excitation light entering the atom cell 2 to a predetermined intensity. In the present embodiment, the intensity of the excitation light LL, which has passed through the optical component 42 described above, and is provided with the predetermined polarization direction, is controlled using the optical component 43.

The optical component 44 is a λ/4 wave plate. Thus, it is possible to convert the excitation light LL from the light emitting section 3 from linearly polarized light to circularly polarized light (right circularly polarized light or left circularly polarized light).

As described later, if the alkali metal atoms are irradiated with the excitation light as the linearly polarized light in the state in which the alkali metal atoms located in the atom cell 2 are Zeeman-split due to the magnetic field by the magnetic field generation section 8 as described later, it results that the alkali metal atoms exist dispersing evenly at a plurality of levels, at which the alkali metal atoms are Zeeman-split, due to a mutual action between the excitation light and the alkali metal atoms. As a result, since the number of the alkali metal atoms at a desired energy level becomes relatively small to the number of the alkali metal atoms at other energy levels, the number of atoms developing the desired EIT phenomenon decreases, and the intensity of the desired EIT signal decreases. As a result, degradation of the oscillation characteristics is caused in the atomic oscillator 1.

In contrast, in the case of irradiating the alkali metal atoms with the excitation light as the circularly polarized light in the state in which the alkali metal atoms located in the atom cell 2 are Zeeman-split due to the magnetic field by the magnetic field generation section 8 as described later, the number of the alkali metal atoms at the desired energy level out of the plurality of levels, at which the alkali metal atoms are Zeeman-split, can be made relatively large to the number of the alkali metal atoms at other energy levels due to a mutual action between the excitation light and the alkali metal atoms. Therefore, the number of the atoms developing the desired EIT phenomenon increases to increase the intensity of the desired EIT signal, and as a result, the oscillation characteristics of the atomic oscillator 1 can be improved.

Light Detection Section

The light detection section 5 has a function of detecting the intensity of the excitation light LL (the first resonance light and the second resonance light) having been transmitted through the atom cell 2.

The light detection section 5 is not particularly limited providing such excitation light as described above can be detected, and for example, a photo detector (a light receiving element) such as a solar cell or a photodiode can be used as the light detection section 5.

Heater

The heater 6 (a heating section) has a function of heating the atom cell 2 (more specifically the alkali metal in the atom cell 2) described above. Thus, the alkali metal located in the atom cell 2 can be kept in the form of a gas with an appropriate density.

The heater 6 is configured including, for example, a heating resistive element for generating heat in accordance with power distribution. The heating resistive element can be disposed so as to have contact with the atom cell 2, or can also be disposed so as not to have contact with the atom cell 2.

For example, in the case of disposing the heating resistive element so as to have contact with the atom cell 2, the heating resistive element is disposed on each of a pair of windows of the atom cell 2. Thus, it is possible to prevent the alkali metal atoms from condensing on the windows of the atom cell 2. As a result, the characteristics (the oscillation characteristics) of the atomic oscillator 1 can be made excellent for a long period of time. Such a heating resistive element is formed of a material having permeability with respect to the excitation light, specifically a transparent electrode material such as an oxide such as ITO (indium tin oxide), IZO (indium zinc oxide), $In_2O_3$, $SnO_2$, Sb-doped $SnO_2$, and Al-doped ZnO. Further, the heating resistive element can be formed using, for example, a chemical vapor deposition (CVD) such as a plasma CVD or a thermal CVD, a dry plating method such as a vacuum deposition, or a sol-gel method.

Further, in the case of disposing the heating resistive element so as not to have contact with the atom cell 2, it is sufficient to conduct the heat from the heating resistive element to the atom cell 2 via a member made of metal, ceramics, or the like superior in heat conductivity.

It should be noted that the heater 6 is not limited to the configuration described above providing the atom cell 2 can be heated, and a variety of types of heaters can be used as the heater 6. Further, it is also possible to heat the atom cell 2 using a Peltier element instead of, or together with the heater 6.

Temperature Sensor

The temperature sensor 7 is for detecting the temperature of the heater 6 or the atom cell 2. Further, an amount of the heat generated by the heater 6 described above is controlled based on the detection result of the temperature sensor 7. Thus, it is possible to keep the alkali metal atoms in the atom cell 2 at a desired temperature.

It should be noted that the installation position of the temperature sensor 7 is not particularly limited, and can also be, for example, a place on the heater 6 or a place on an outside surface of the atom cell 2.

The temperature sensor 7 is not particularly limited, and a variety of known temperature sensors such as a thermistor or a thermocouple can be used as the temperature sensor 7.

Magnetic Field Generation Section

The magnetic field generation section 8 has a function of generating the magnetic field for Zeeman-splitting the degenerate energy levels of the alkali metal in the atom cell 2. Thus, it is possible to enlarge the degenerate gap between the energy levels different from each other of the alkali metal using the Zeeman split to thereby improve the resolution. As a result, the accuracy of the oscillation frequency of the atomic oscillator 1 can be improved.

The magnetic field generation section 8 is formed of, for example, a Helmholtz coil disposed so as to sandwich the atom cell 2, or a solenoid coil disposed so as to cover the atom cell 2. Thus, it is possible to generate a unidirectional and uniform magnetic field in the atom cell 2.

Further, the magnetic field generated by the magnetic field generation section 8 is a constant magnetic field (direct-current magnetic field), but can also be superimposed with an alternating-current magnetic field.

Control Section

The control section 10 has a function of controlling each of the light emitting section 3, the heater 6, and the magnetic field generation section 8.

The control section 10 has an excitation light control section 12 for controlling the frequencies of the first resonance light and the second resonance light of the light emitting section 3, a temperature control section 11 for controlling the temperature of the alkali metal in the atom cell 2, and a magnetic field control section 13 for controlling the magnetic field generated by the magnetic field generation section 8.

The excitation light control section 12 controls the frequencies of the first resonance light and the second resonant light emitted from the light emitting section 3 based on the detection result of the light detection section 5 described above. More specifically, the excitation light control section 12 controls the frequencies of the first resonance light and the second resonance light emitted from the light emitting section 3 so that the frequency difference ($\omega_1-\omega_2$) described above becomes equal to the frequency $\omega_0$ inherent in the alkali metal described above.

Here, the excitation light control section 12 is provided with a voltage controlled quartz crystal oscillator (an oscillation circuit) although not shown, and outputs an output signal of the voltage controlled quartz crystal oscillator as an output signal while synchronizing and adjusting the oscillation frequency of the voltage controlled quartz crystal oscillator based on the detection result of the light detection section 5.

For example, although not shown, the excitation light control section 12 is provided with a frequency multiplier for multiplying the frequency of the output signal from the voltage controlled quartz crystal oscillator, superimposes a signal (a high-frequency signal) obtained by the multiplication by the frequency multiplier on a direct-current bias current, and then input the result to the light emitting section 3 as a drive signal. Thus, it results that the signal with the desired frequency is output from the voltage controlled quartz crystal oscillator by controlling the voltage controlled quartz crystal oscillator so that the EIT signal is detected by the light detection section 5. The multiplication ratio of the frequency multiplier is $\omega_0/(2\times f)$ assuming that, for example, the desired frequency of the output signal from the atomic oscillator 1 is f. Therefore, it is possible to modulate the light emitting element such as a semiconductor laser included in the light emitting section 3 to emit the two types of light having the frequency difference ($\omega_1-\omega_2$) equal to $\omega_0$ using the signal from the frequency multiplier when the oscillation frequency of the voltage controlled quartz crystal oscillator is f.

Further, the temperature control section 11 controls distribution of the power to the heater 6 based on the detection result of the temperature sensor 7. Thus, the atom cell 2 can be kept within the desired temperature range. For example, the atom cell 2 is controlled in temperature by the heater 6 to, for example, around 70° C.

Further, the magnetic field control section 13 controls the distribution of the power to the magnetic field generation section 8 so that the magnetic field generated by the magnetic field generation section 8 becomes constant.

Such a control section 10 is disposed in, for example, an IC chip mounted on a substrate.

Hereinabove, the configuration of the atomic oscillator 1 is briefly described.

Detailed Description of Atom Cell

Figure 4A:
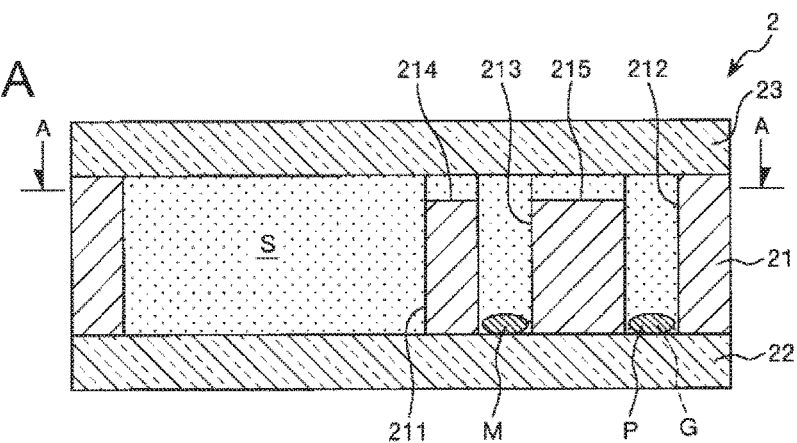
FIG. 4A is a vertical cross-sectional view of an atom cell provided to the atomic oscillator shown in FIG. 1.
Figure 4B:
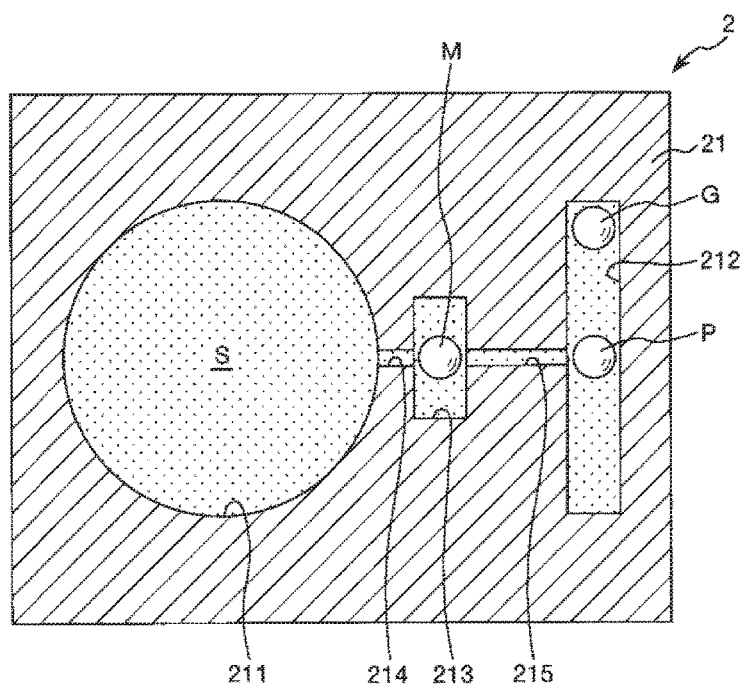
FIG. 4B is a cross-sectional view (a horizontal cross-sectional view) along the line A-A in FIG. 4A.

FIG. 4A is a vertical cross-sectional view of the atom cell provided to the atomic oscillator shown in FIG. 1, and FIG. 4B is a cross-sectional view (a horizontal cross-sectional view) along the line A-A in FIG. 4A.

It should be noted that the upper side of FIG. 4A is referred to as an "upper side," and the lower side thereof is referred to as a "lower side" in the following descriptions for the sake of convenience of explanation.

As shown in FIG. 4A, the atom cell 2 has a body section 21, and a pair of window sections 22, 23 disposed sandwiching the body section 21. In the atom cell 2, the body section 21 is disposed between the pair of windows 22, 23, and the body section 21 and the pair of window sections 22, 23 compartment (form) an internal space S in which the gaseous alkali metal is encapsulated.

The body section 21 has a plate-like shape having a vertical direction as the thickness direction, and is provided with through holes 211, 212, and 213 penetrating in the thickness direction of the body section 21 (the vertical direction), a groove 214 opening on an upper surface of the body section 21 to communicate the through hole 211 and the through hole 213 with each other, and a groove 215 opening on the upper surface of the body section 21 to communicate the through hole 212 and the through hole 213. It should be noted that it is also possible to form a recessed section opening on the upper surface of the body section 21 instead of the through hole 212. Similarly, it is also possible to form a recessed section opening on the upper surface of the body section 21 instead of the through hole 213.

The constituent material of the body section 21 is not particularly limited, and there can be cited a glass material, a quartz crystal, a metal material, a resin material, a silicon material, and so on as the constituent material of the body section 21. Among these materials, either of the glass material, the quartz crystal, and the silicon material is preferably used, and the silicon material is further preferably used. Thus, even in the case of forming a small atom cell 2 with the width and the height equal to or smaller than 10 mm, it is possible to easily form the body section 21 high in accuracy using a microfabrication technology such as etching. In particular, the microfabrication by etching can be performed on silicon. Therefore, by forming the body section 21 using silicon, even in the case of achieving miniaturization of the atom cell 2, the body section 21 can easily and accurately be formed. Further, in the case in which the window sections 22, 23 are formed of glass, the body section 21 and the window sections 22, 23 can airtightly be bonded to each other with ease using anodic bonding, and thus the reliability of the atom cell 2 can be made excellent.

To the lower surface of such a body section 21, there is bonded the window section 22 having a plate-like shape, and on the other hand, to the upper surface of the body section 21, there is bonded the window 23 having a plate-like shape. Thus, the lower-end side opening of each of the through holes 211, 212, and 213 is blocked by the window 22, and at the same time, the upper-end side opening of each of the through holes 211, 212, and 213 and the opening of each of the grooves 214, 215 are blocked by the window 23. Further, the internal space S constituted by the through holes 211, 212, and 213 and the grooves 214, 215 is formed as an airtight space.

The bonding method between the body section 21 and the window sections 22, 23 is determined in accordance with the constituent materials of these sections, and is not particularly limited providing the body section 21 and the window sections 22, 23 can airtightly be bonded to each other. As the bonding method, there can be used, for example, a bonding method using an adhesive, a direct bonding method, an anodic bonding method, and a surface activated bonding method, and the direct bonding method or the anodic bonding method is preferably used. Thus, the body section 21 and the window sections 22, 23 can airtightly be bonded to each other with ease, and the reliability of the atom cell 2 can be made excellent.

The window sections 22, 23 bonded to such a body section 21 each have permeability with respect to the excitation light from the light emitting section 3. Further, one of the window sections, namely the window section 22, is an entrance side window section through which the excitation light LL enters the internal space S of the atom cell 2, and the other of the window sections, namely the window section 23, is an exit side window section through which the excitation light LL is emitted from the internal space S of the atom cell 2.

The constituent material of the window sections 22, 23 is not particularly limited providing such permeability with respect to the excitation light as described above is provided, and as the constituent material of the window sections 22, 23, there can be cited, for example, a glass material and a quartz crystal, and the glass material is preferably used. Thus, there can be realized the window sections 22, 23 having the permeability with respect to the excitation light. Further, in the case in which the body section 21 is formed of silicon, by forming the window sections 22, 23 using glass, the body section 21 and the window sections 22, 23 can airtightly be bonded to each other with ease using anodic bonding, and thus the reliability of the atom cell 2 can be made excellent. It should be noted that depending on the thickness of the window sections 22, 23 and the intensity of the excitation light, the window sections 22, 23 can be formed of silicon. In this case, the body section 21 and the window sections 22, 23 can directly be bonded to each other.

In the internal space S formed as a compartment by such a body section 21 and such window sections 22, 23, there is housed the gaseous alkali metal. The gaseous alkali metal housed in the internal space S is excited by the excitation light LL in the through hole 211. Specifically, at least a part of the space in the through hole 211 constitutes a "light passing space" (a first region) through which the excitation light LL passes. In the present embodiment, the cross-sectional surface of the through hole 211 has a circular shape, and in contrast, the cross-sectional surface of the light passing space has a similar shape (i.e., a circular shape) to the cross-sectional surface of the through hole 211 although not shown, and is set to be slightly smaller than the cross-sectional surface of the through hole 211. It should be noted that the cross-sectional shape of the through hole 211 is not limited to the circular shape, but can also be a polygonal shape such as a quadrangular shape or a pentangular shape, an elliptical shape, or the like.

Further, the space in the through hole 213 out of the internal space S is communicated with a space in the through hole 211 via a space in the groove 214, and is also communicated with a space in the through hole 212 via a space in the groove 215. In the present embodiment, the cross-sectional surfaces of the through holes 212, 213 each have a rectangular shape. It should be noted that the cross-sectional shapes of the through holes 212, 213 are not limited to a rectangular shape, but can also be a polygonal shape such as a pentangular shape, a circular shape, an elliptical shape, or the like.

In the space in the through hole 213, there is housed alkali metal M in the form of a liquid or a solid. In other words, the space in the through hole 213 is a space constituting a part of the internal space S or communicated with the internal space S, and constitutes a "metal storage section" (a third region) in which the liquid or solid alkali metal M is disposed. The liquid or solid alkali metal M is held in equilibrium with the gaseous alkali metal in the internal space S at the saturated vapor pressure, and thus, the gaseous alkali metal in the internal space Scan be kept at a predetermined density. Further, by disposing the alkali metal M in the space in the through hole 213 separated from the space in the through hole 211, it is possible to reduce the chances for the alkali metal M to affect the frequency characteristics.

Further, in the space in the through hole 212, there are disposed the compound P and the getter material G.

The compound P is an "alkali metal emission material" having emitted the gaseous alkali metal and the solid alkali metal M described above, and is a residual dross of a decomposition reaction of a metal compound P1 used for the production of the atom cell 2 described later, and is an unreacted part of the metal compound P1, for example. Further, the compound P includes a product other than the alkali metal produced by the decomposition reaction of the metal compound P1 in some cases. Further, by disposing the compound P in the space in the through hole 212 separated from the space in the through hole 211, it is possible to reduce the chances for the compound P to affect the frequency characteristics.

It should be noted that in the case in which the product other than the alkali metal produced by the decomposition reaction of the metal compound P1 is an inert gas such as nitrogen, such a product can be used as a part of the buffer gas.

The getter material G has a function of adsorbing or absorbing a gas other than the desired alkali metal gas or the buffer gas. Thus, it is possible to make the getter material G adsorb or absorb at least a part of the unwanted material other than the alkali metal atoms existing in the internal space S. Therefore, an amount of the unwanted material suspended in the atom cell 2 can be reduced, and as a result, it is possible to prevent or reduce the degradation of the frequency stability due to the influence exerted on the EIT signal caused by a change in behavior of the alkali metal atoms due to the unwanted material in the atom cell 2. Therefore, the frequency stability can be improved. Further, by disposing the getter material G in the space in the through hole 212 separated from the space in the through hole 211, it is possible to reduce the chances for the getter material G to affect the frequency characteristics.

It should be noted that the compound P, the metal compound P1, the getter material G will be described in detail together with a method of manufacturing the atom cell 2 described later.

As described above, the internal space S of the atom cell 2 includes the first region (the space formed of the through hole 211) housing the gaseous alkali metal (the alkali metal atoms), a second region (the space formed of the through hole 212) housing the compound P as the alkali metal emission material, and the third region (the space formed of the through hole 213) housing the liquid or solid alkali metal M. According to such an atom cell 2, since the liquid or solid alkali metal M exists in the third region of the internal space S as an excess, it is possible to prevent the amount (partial pressure) of the gaseous alkali metal existing in the first region of the internal space S sealed from decreasing. Therefore, it is possible to realize the excellent frequency stability for a long period of time.

Here, the temperature in the through hole 211 is higher than the temperature in the through hole 213. Thus, it is possible to make the gaseous alkali metal atoms and the liquid or solid alkali metal stably exist in the through hole 211 and the through hole 213, respectively.

Further, in the present embodiment, the space formed of the through hole 213 is located between the space formed of the through hole 211 and the space formed of the through hole 212. Thus, as described later, even in the case of separating and then removing the space formed of the through hole 212, it is possible to communicate the space formed of the through hole 211 and the space formed of the through hole 213 with each other, and the amount of the gaseous alkali metal atoms existing in the space formed of the through hole 211 can be prevented from decreasing.

Further, the width of the grooves 214, 215 constituting the communication holes communicating the space formed of the through hole 211 and the space formed of the through hole 212 with each other is smaller than the width of the compound P. Thus, it is possible to prevent the compound P from moving from the inside of the through hole 212 to the inside of the through hole 211.

Such an atom cell 2 as described above provided to the atomic oscillator 1 can be manufactured in such a manner as described below. Thus, the partial pressure of the gas other than the gaseous alkali metal atoms in the internal space S can be set to a level equal to or lower than $10^{-4}$ Pa. Such an atom cell 2 small in the amount of unwanted gas has excellent characteristics.

Method of Manufacturing Atom Cell

Hereinafter, a method of manufacturing the atom cell according to the invention will be described citing the case of manufacturing the atom cell 2 described above as an example. It should be noted that the description is hereinafter presented citing the case in which the body section 21 is formed of silicon, and the window sections 22, 23 are each formed of glass as an example.

Figure 5:
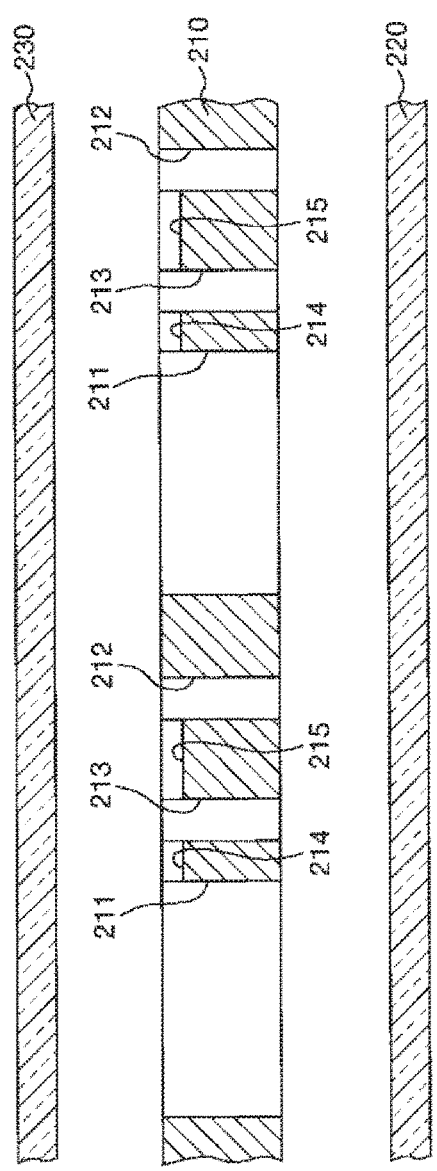
FIG. 5 is a diagram showing a member used for a preparatory process in a method of manufacturing the atom cell shown in FIGS. 4A and 4B.

FIG. 5 is a diagram showing a member used for a preparatory process in the method of manufacturing the atom cell shown in FIGS. 4A and 4B. FIGS. 6A through 6C are diagrams for describing the preparatory process, an emission process, a temperature adjustment process, and a segmenting process in the method of manufacturing the atom cell shown in FIGS. 4A and 4B.

The method of manufacturing the atom cell 2 includes [1] preparatory process, [2] emission process, [3] temperature adjustment process, and [4] segmenting process. Hereinafter, each of the processes will sequentially be described.

1 Preparatory Process 1-1.

Firstly, as shown in FIG. 5, there are prepared a body section forming substrate 210 and window section forming substrates 220, 230.

The body section forming substrate 210 is a silicon substrate used for forming the body section 21 described above, and has the through holes 211, 212, and 213, and the grooves 214, 215. Further, the window section forming substrate 220 is a glass substrate used for forming the window section 22 described above. Similarly, the window section forming substrate 230 is a glass substrate used for forming the window section 23 described above.

As described above, since the body section forming substrate 210 includes silicon, and the window section forming substrates 220, 230 each include glass, it is possible to manufacture the atom cell 2 small in size and high in accuracy using an etching technology and a photolithography technology.

In the present embodiment, the body section forming substrate 210 has a plurality of sets of the through holes 211, 212, and 213, and the grooves 214, 215, and is then segmented into the body sections 21 in the segmenting process [4] described later. Further, the window section forming substrates 220, 230 are segmented into the window sections 22, 23 in the segmenting process [4] described later.

1-2.

Then, as shown in FIG. 6A, the body section forming substrate 210 and the window section forming substrates 220, 230 are bonded to each other (a first bonding process) in the state in which the metal compound P1 and the getter material G are disposed in the internal space S.

In the detailed description, firstly, the body section forming substrate 210 and the window section forming substrate 220 are bonded to each other. Thus, there can be obtained a bonded body (a laminated body) having the body section forming substrate 210 and the window section forming substrate 220 bonded to each other.

Bonding between the body section forming substrate 210 and the window section forming substrate 220 is preferably achieved by anodic bonding as a kind of heating bonding. Thus, the body section forming substrate 210 and the window section forming substrate 220 can airtightly be bonded to each other with relative ease.

It should be noted that it is also possible to bond the body section forming substrate 210 and the window section forming substrate 230 to each other. In this case, it is sufficient to bond the body section forming substrate 210 and the window section forming substrate 220 to each other after disposing the metal compound P1 and the getter material G, and before the emission process [2].

Then, the metal compound P1 and the getter material G are disposed in the recessed section formed of the through hole 212 (a disposition process). Further, on this occasion, although not shown in the drawings, a reducing agent necessary for the decomposition reaction of the metal compound P1 is disposed in the recessed section if needed.

The metal compound P1 is a compound including the alkali metal, and is a compound (an alkali metal emission material) for generating (emitting) the alkali metal as a simple substance by a decomposition reaction (reduction). The metal compound P1 is not particularly limited providing the compound generates the alkali metal as a simple substance by a decomposition reaction (reduction), and for example, cesium chloride (CsCl), cesium azide (CsN$_3$), and cesium chromate (CsCr$_2$O$_7$) can be cited as the metal compound P1. Here, it is preferable for the metal compound P1 to be a compound not substantially developing the decomposition reaction under the heat when performing bonding (a second bonding process) between the body section forming substrate 210 and the window section forming substrate 230 described later, in other words, to be a compound developing the decomposition reaction at a temperature higher than the temperature at which the body section forming substrate 210 and the window section forming substrate 230 are heated when bonding the body section forming substrate 210 and the window section forming substrate 230 to each other. Thus, it is possible to prevent the alkali metal from adhering to the bonding surfaces of the body section forming substrate 210 and the window section forming substrate 230, or to reduce the chances for the alkali metal to adhere to the bonding surfaces of the body section forming substrate 210 and the window section forming substrate 230.

Further, the reducing agent used for the decomposition reaction of the metal compound P1 is not particularly limited, and in the case in which, for example, the metal compound P1 is cesium chloride, calcium is used as the reducing agent. It should be noted that the reducing agent can be a separated body from the metal compound P1, or can be integrated with the metal compound P1 as a mixture or an aggregate with the metal compound P1.

Further, the getter material G has a function of adsorbing or absorbing a gas other than the desired alkali metal gas or the buffer gas. The getter material G is not particularly limited providing such a function is provided, and as the getter material G, there can be cited, for example, an alloy including at least one of titanium, barium, tantalum, zirconium, aluminum, vanadium, indium, and calcium, or an Al—Zr—V—Fe series alloy. By using such a getter material G, it is possible to make the getter material G adsorb or absorb the gaseous unwanted materials in the internal space S after the second bonding process described later. It should be noted that the getter material G can be a separated body from the metal compound P1, or can be integrated with the metal compound P1 as a mixture or an aggregate with the metal compound P1.

Then, the body section forming substrate 210 (one surface side of the first substrate) and the window section forming substrate 230 are bonded to each other (the second bonding process; a sealing process). Thus, the recessed sections respectively formed of the through holes 211, 212, and 213 and the grooves 214, 215 are sealed, and thus, the internal space S is formed.

As the bonding method between the body section forming substrate 210 and the window section forming substrate 230, there can be used substantially the same method as the bonding method between the body section forming substrate 210 and the window section forming substrate 220 described above.

In the anodic bonding, the body section forming substrate 210 and the window section forming substrates 220, 230 become high in temperature on the one hand, and the alkali metal as a simple substance, for example, is relatively low in melting point and boiling point on the other hand. Therefore, if the alkali metal as a simple substance exists in the heating bonding, the alkali metal adheres to the bonding surfaces of the body section forming substrate 210 and the window section forming substrate 230 to incur degradation of the bonding strength. In contrast, in the second bonding process (the sealing process), since the metal compound P1 disposed in the recessed section formed of the through hole 212 keeps the solid state even under the heat in the anodic bonding, it is possible to prevent the alkali metal from adhering to the bonding surfaces of the body section forming substrate 210 and the window section forming substrate 230, or to reduce the chances for the alkali metal to adhere to the bonding surfaces of the body section forming substrate 210 and the window section forming substrate 230.

As described above, in the preparatory process [1], there is prepared a bonded body formed of the body section forming substrate 210 and the window section forming substrates 220, 230. The bonded body is a plurality of "cell containers" each having the internal space S including the through holes 211, 212, and 213 communicated with each other, and housing the solid compound including the alkali metal in the through hole 212 of the internal space S.

Here, since the plurality of cell containers is connected to one another, a plurality of atom cells 2 can efficiently be manufactured through the segmenting process [4] described later.

Further, since the preparatory process [1] includes a step of sealing the internal space S as described above, the amount of the unwanted gas in the internal space S of the atom cell 2 obtained can be reduced.

2 Emission Process (Compound Decomposition Process)

Then, as shown in FIG. 6B, the metal compound P1 is irradiated with a laser beam (an energy beam). Thus, by making the metal compound P1 develop the decomposition reaction, the alkali metal simple substance is taken out.

On this occasion, due to the decomposition reaction of the metal compound P1, a reaction product other than the alkali metal occurs, and at the same time, the unreacted part of the metal compound P1 remains as the residual dross to form the compound P.

In the specific description, in the case in which, for example, the metal compound P1 is cesium chloride, and calcium is used as the reducing agent, in the present process, there occurs the following reaction.

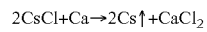
2CsCl+Ca→2Cs↑+CaCl$_2$

As described above, by reducing cesium chloride using calcium as the reducing agent, cesium can be taken out as a simple substance. Therefore, the cesium atoms can be encapsulated in the atom cell 2.

Further, in the case in which the metal compound P1 is cesium azide, the following reaction develops in the present process.

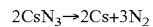
2CsN$_3$→2Cs+3N$_2$

As described above, by reducing cesium azide, cesium can be taken out as a simple substance. Therefore, the cesium atoms can be encapsulated in the atom cell 2.

In the present process, since the decomposition reaction is caused by irradiating the metal compound P1 with the energy beam, the metal compound P1 disposed in the internal space S thus sealed can be made to develop the decomposition reaction. It should be noted that although in FIG. 6B, there is illustrated the case of causing the decomposition reaction of the metal compound P1 using the laser beam as an example, besides the laser beam, there can be cited, for example, a light beam other than the laser beam, an electromagnetic ray such as an X ray or a γ ray, a particle beam such as an electron beam or an ion beam, or a beam obtained by combining two or more of these energy beams with each other providing the decomposition reaction of the metal compound P1 is caused. Further, it is also possible to heat the metal compound P1 using electromagnetic induction to cause the decomposition reaction.

In such a manner as described above, by heating the inside of the through hole 212, there is performed the emission process of emitting the alkali metal from the metal compound P1.

3 Temperature Adjustment Process

The temperature in the vicinity of the through hole 213 is decreased to a level lower than the temperature in the vicinity of the through hole 211 at the same time as or after the emission process [2]. In the emission process [2] described above, the gaseous alkali metal equal to or more than the saturated amount is emitted from the metal compound P1. Therefore, by decreasing the temperature in the vicinity of the through hole 213 to a level lower than the temperature in the vicinity of the through hole 211, it is possible to condense the liquid or solid alkali metal M inside the through hole 213.

It should be noted that although in FIGS. 6A through 6C, there is illustrated the case of performing the temperature adjustment process [3] at the same time as (in the period overlapping) the emission process [2] as an example, the temperature adjustment process [3] can also be performed after the emission process [2] or after the segmenting process [4] described later. Further, although in FIGS. 6A through 6C, there is illustrated the case of cooling the vicinity of the through hole 213 as an example, the invention is not limited to this configuration providing there is provided a relationship in which the temperature in the vicinity of the through hole 213 becomes lower than the temperature in the vicinity of the through holes 211, 212, and it is also possible to, for example, heat the vicinity of the through hole 211.

In such a manner as described above, there is performed the temperature adjustment process of decreasing the temperature in the through hole 211 to a level lower than the temperature in the through hole 213.

4 Segmenting Process

Then, the layered structure (the bonded body) formed of the body section forming substrate 210 and the window section forming substrates 220, 230 is segmented by, for example, dicing. Thus, the atom cell 2 can be obtained as shown in FIG. 6C.

According to such a method of manufacturing the atom cell 2 as described above, the atom cell 2 exerting such an advantage as described above can be obtained. Specifically, it is possible to obtain the atom cell 2 in which the liquid or solid alkali metal M exists as an excess in the through hole 213 of the internal space S. According to the atom cell 2 thus obtained, it is possible to prevent the amount (the partial pressure) of the gaseous alkali metal atoms located inside the through hole 211 of the internal space S sealed from decreasing, and thus the excellent frequency stability can be realized for a long period of time.

Further, since the alkali metal atoms are encapsulated in the internal space S using the solid alkali metal compound P1, it is possible to prevent the alkali metal atoms from adhering to the bonding surfaces of the body section forming substrate 210 and the window section forming substrate 230.

Therefore, the body section forming substrate 210 and the window section forming substrate 230 can easily and firmly be bonded to each other. As a result, the reliability of the atom cell 2 can be improved.

Modified Example

Figure 7A:
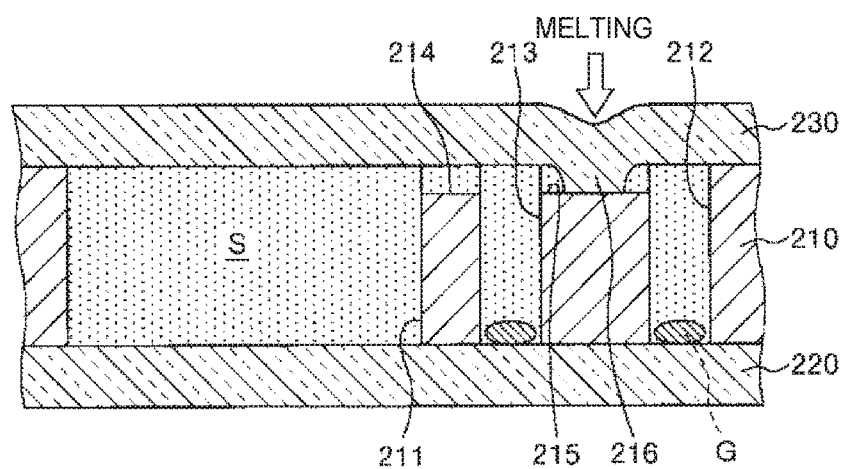
FIGS. 7A and 7B are diagrams for describing a modified example of the atom cell according to the first embodiment of the invention.
Figure 7B:
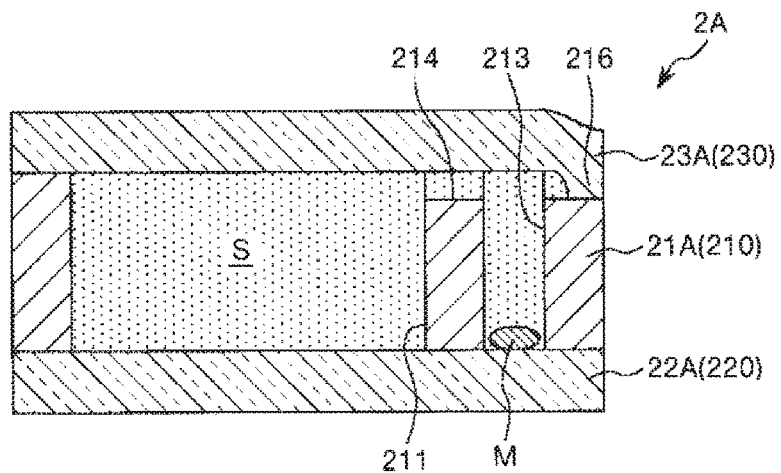

FIGS. 7A and 7B are diagrams for describing a modified example of the atom cell according to the first embodiment of the invention.

The atom cell 2 described above can be incorporated in the atomic oscillator 1 with the configuration without modification, but can also be used in the configuration in which the space (the communication hole) formed of the groove 215 is blocked, or can also be used in the configuration in which the space (the communication hole) formed of the groove 215 is blocked, and at the same time, the space formed of the through hole 212 is separated and then removed.

In the case of such configurations, for example, in the method of manufacturing the atom cell 2 described above, the window section forming substrate 230 is melted in the vicinity of the groove 215 to form a sealing section 216, and then the inside of the groove 215 is blocked by the sealing section 216 as shown in FIG. 7A after the temperature adjustment process [3] and before the segmenting process [4]. Subsequently, the segmenting process is performed, and at the same time the part corresponding to the through hole 212 is removed by, for example, dicing. Thus, as shown in FIG. 7B, the atom cell 2A having a body section 21A and window sections 22A, 23A bonded to each other can be obtained. The atom cell 2A corresponds to the configuration in which the space (the communication hole) formed of the groove 215 is blocked and the space formed of the through hole 212 is separated and then removed in the atom cell 2 described above.

According to such an atom cell 2A as described hereinabove, since the compound P and the getter material G do not exist in the internal space S, there is no chance for the compound P and the getter material G to, for example, adsorb the necessary gas existing in the internal space S, and it is possible to reduce the variation in the gas composition in the internal space S.

Here, by providing the removal process of removing the through hole 212 after the emission process [2], the compound P having emitted the alkali metal can be eliminated in the atom cell 2A thus obtained to reduce the influence of the compound P to thereby enhance the frequency stability.

Further, by performing the removal process after the temperature adjustment process [3], the compound P having emitted the alkali metal can be eliminated in the atom cell 2A obtained.

As described above, in the preparatory process [1], the inside of the through hole 211 and the inside of the through hole 212 are communicated with each other via the grooves 214, 215, and the removal process includes the step of blocking the groove 215. Thus, the internal space S from which the through hole 212 has been removed can easily be sealed.

Second Embodiment

Then, a second embodiment of the invention will be described.

Figure 8A:
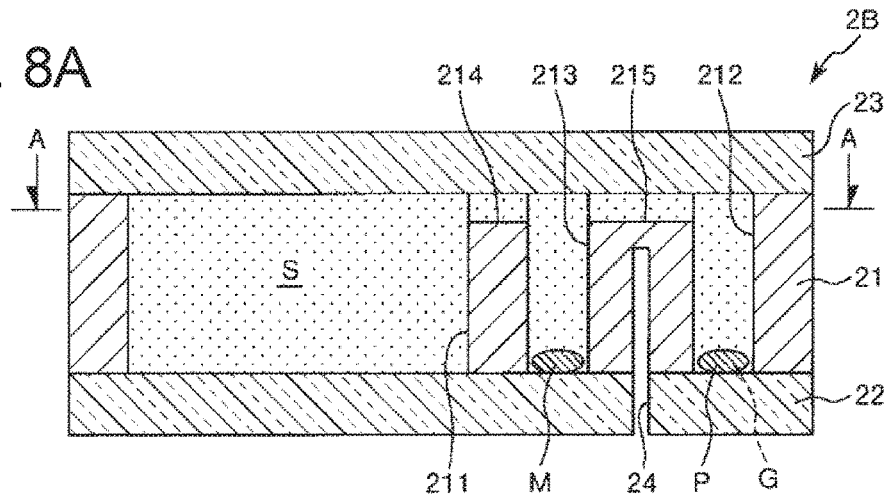
FIG. 8A is a vertical cross-sectional view of an atom cell provided to an atomic oscillator according to a second embodiment of the invention.
Figure 8B:
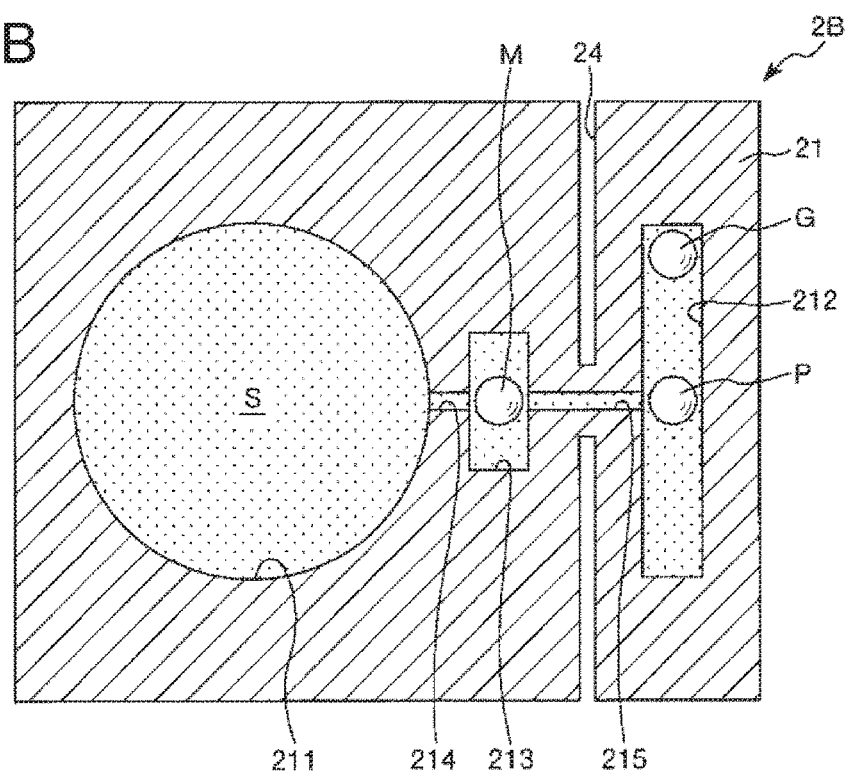
FIG. 8B is a cross-sectional view (a horizontal cross-sectional view) along the line A-A in FIG. 8A.
Figure 9A:
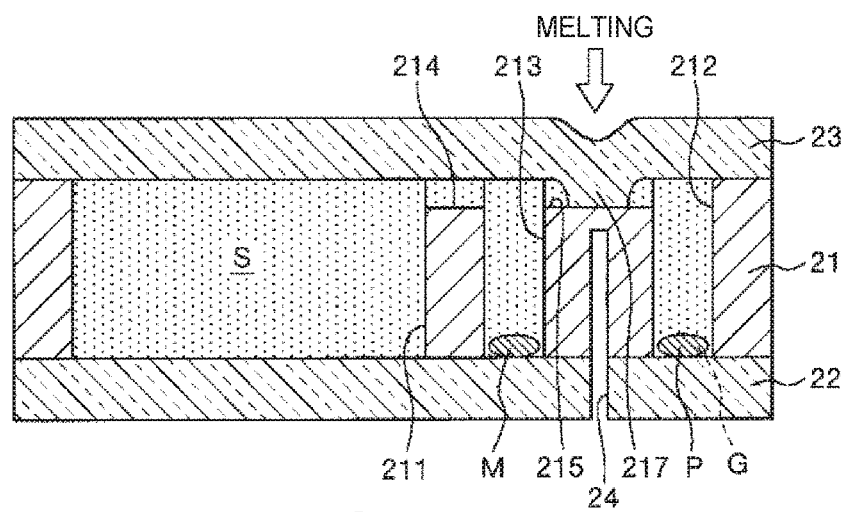
FIGS. 9A and 9B are diagrams for describing a modified example of the atom cell according to the second embodiment of the invention.
Figure 9B:
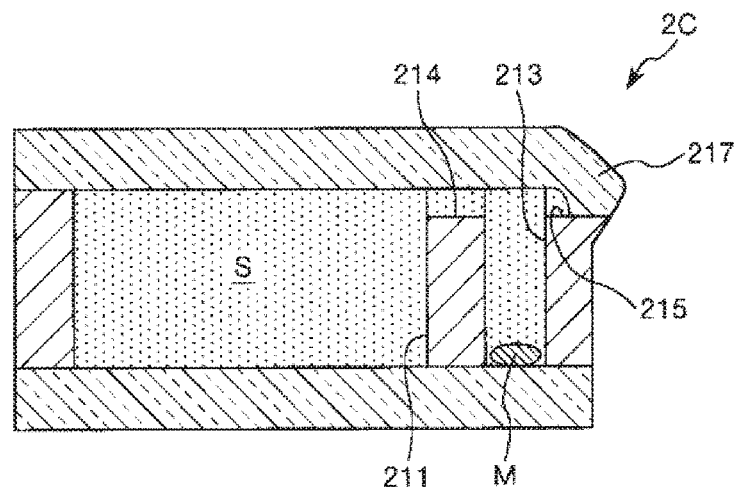

FIG. 8A is a vertical cross-sectional view of an atom cell provided to an atomic oscillator according to the second embodiment of the invention, and FIG. 8B is a cross-sectional view (a horizontal cross-sectional view) along the line A-A in FIG. 8A. FIGS. 9A and 9B are diagrams for describing a modified example of the atom cell according to the second embodiment of the invention.

The present embodiment is substantially the same as the first embodiment except the point that a slit for making the removal of the second region easy is provided to the atom cell.

It should be noted that in the description below, the second embodiment will be described with a focus on the difference from the embodiment described above, and the description for substantially the same issues will be omitted.

In the atom cell 2B (the gas cell) shown in FIGS. 8A and 8B, the slit 24 is formed in the periphery of the groove 215. In other words, a weak section weaker than other portions is formed in the periphery of the groove 215. Thus, it becomes easy to block the space (the communication hole) formed of the groove 215, and at the same time, separate the space formed of the through hole 212.

For example, as shown in FIG. 9A, the vicinity of the groove 215 of the window section 23 is melted to form a sealing section 217 to thereby block the groove 215 with the sealing section 217. On this occasion, since the weak section is formed in the periphery of the groove 215 as described above, the part corresponding to the through hole 212 can be removed at the same time as melting the vicinity of the groove 215. Thus, the atom cell 2C can be obtained as shown in FIG. 9B. The atom cell 2C corresponds to the configuration in which the space (the communication hole) formed of the groove 215 is blocked and the space formed of the through hole 212 is separated and then removed in the atom cell 2B described above.

Third Embodiment

Then, a third embodiment of the invention will be explained.

Figure 10:
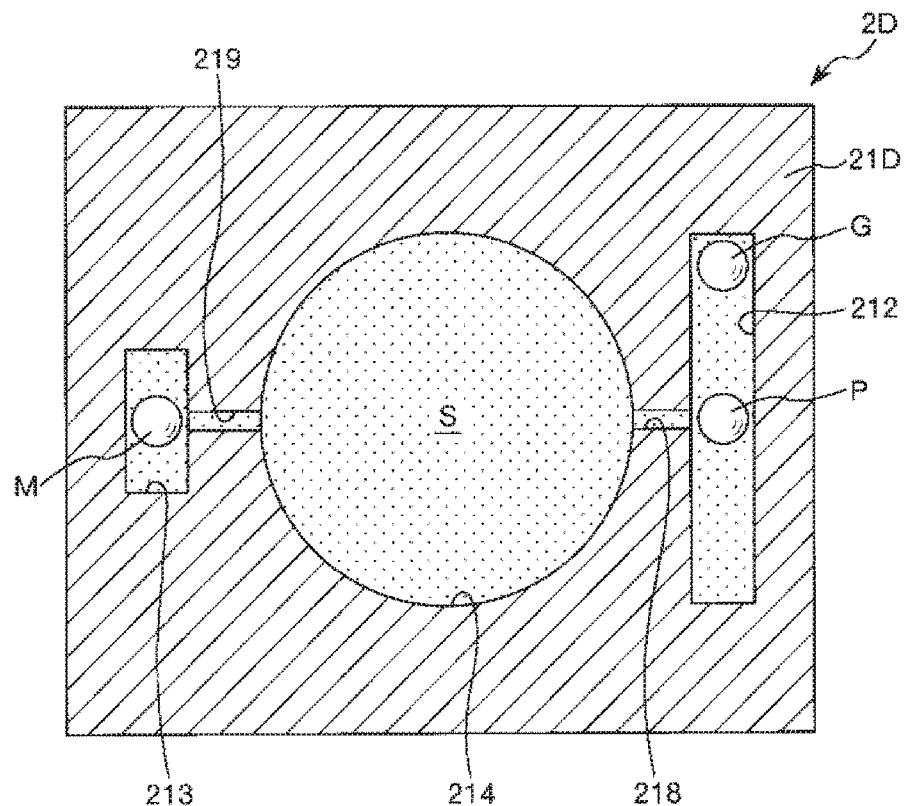
FIG. 10 is a horizontal cross-sectional view showing an atom cell provided to an atomic oscillator according to a third embodiment of the invention.

FIG. 10 is a horizontal cross-sectional view showing an atom cell provided to an atomic oscillator according to the third embodiment of the invention.

The present embodiment is substantially the same as the first embodiment described above except the point that the positional relationship of the second region and the third region with respect to the first region is different.

It should be noted that in the description below, the third embodiment will be described with a focus on the difference from the embodiment described above, and the description for substantially the same issues will be omitted.

In a body section 21D of the atom cell 2D shown in FIG. 10, the through hole 211 is disposed between the through hole 212 and the through hole 213. In other words, the through hole 212 is disposed on one side, and the through hole 213 is disposed on the other side with respect to the through hole 211. Further, the through hole 212 is communicated with the through hole 211 via a groove 218, and the through hole 213 is communicated with the through hole 211 via a groove 219.

According to such an atom cell 2D, since the space (the first region) formed of the through hole 211 is located between the space (the second region) formed of the through hole 212 and the space (the third region) formed of the through hole 213, in the case of heating the inside of the through hole 212 to emit the alkali metal atoms from the alkali metal emission material, the temperature in the through hole 213 can easily be set to a level lower than the temperature in the through hole 212. Therefore, the liquid or solid alkali metal M can easily be housed in the through hole 213. It should be noted that the positional relationship between the through holes 212, 213 in the circumferential direction of the through hole 211 is not limited to the example shown in the drawings, and it is also possible to dispose the through hole 212, for example, on the upper side or the lower side in FIG. 10 with respect to the through hole 211.

2. Electronic Apparatus

Such an atomic oscillator as described hereinabove can be incorporated in a variety of electronic apparatuses.

The electronic apparatus according to the invention will hereinafter be described.

Figure 11:
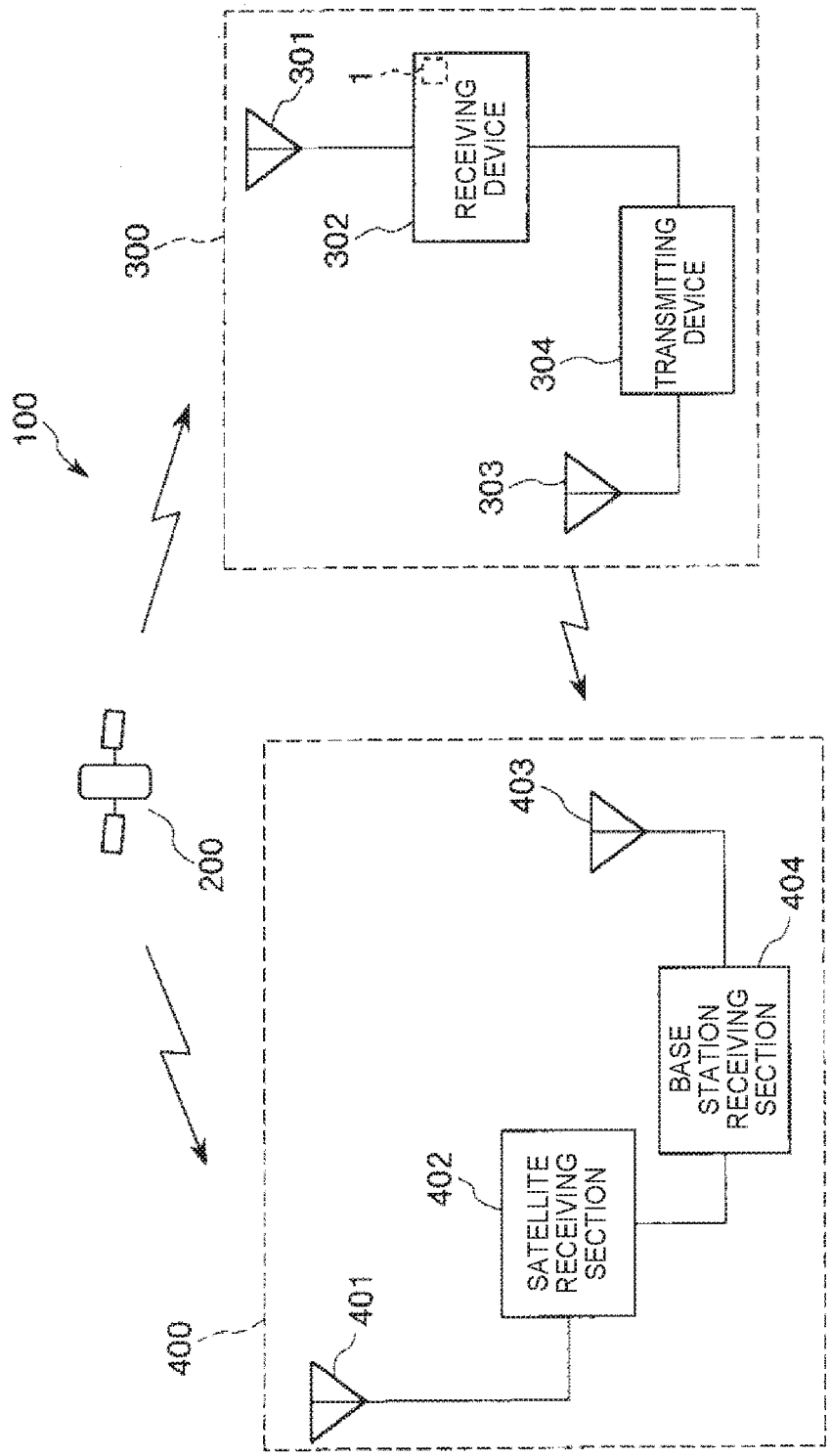
FIG. 11 is a diagram showing a schematic configuration in the case of using the atomic oscillator according to the invention to a positioning system using GPS satellites.

FIG. 11 is a diagram showing a schematic configuration in the case of using the atomic oscillator according to the invention to a positioning system using GPS satellites.

The positioning system 100 shown in FIG. 11 is constituted by GPS satellites 200, a base station device 300, and a GPS receiving device 400.

The GPS satellites 200 each transmit positioning information (a GPS signal).

The base station device 300 is provided with a receiving device 302 for accurately receiving the positioning information from the GPS satellites 200 via an antenna 301 installed at, for example, an electronic reference point (a GPS continuous observation station), and a transmitting device 304 for transmitting the positioning information, which has been received by the receiving device 302, via an antenna 303.

Here, the receiving device 302 is an electronic device equipped with the atomic oscillator 1 according to the invention described above as a reference frequency oscillation source for the receiving device 302. Such a receiving device 302 has excellent reliability. Further, the positioning information having been received by the receiving device 302 is transmitted by the transmitting device 304 in real time.

The GPS receiving device 400 is provided with a satellite receiving section 402 for receiving the positioning information from the GPS satellites 200 via an antenna 401, and a base station receiving section 404 for receiving the positioning information from the base station device 300 via an antenna 403.

3. Moving Object

Figure 12:
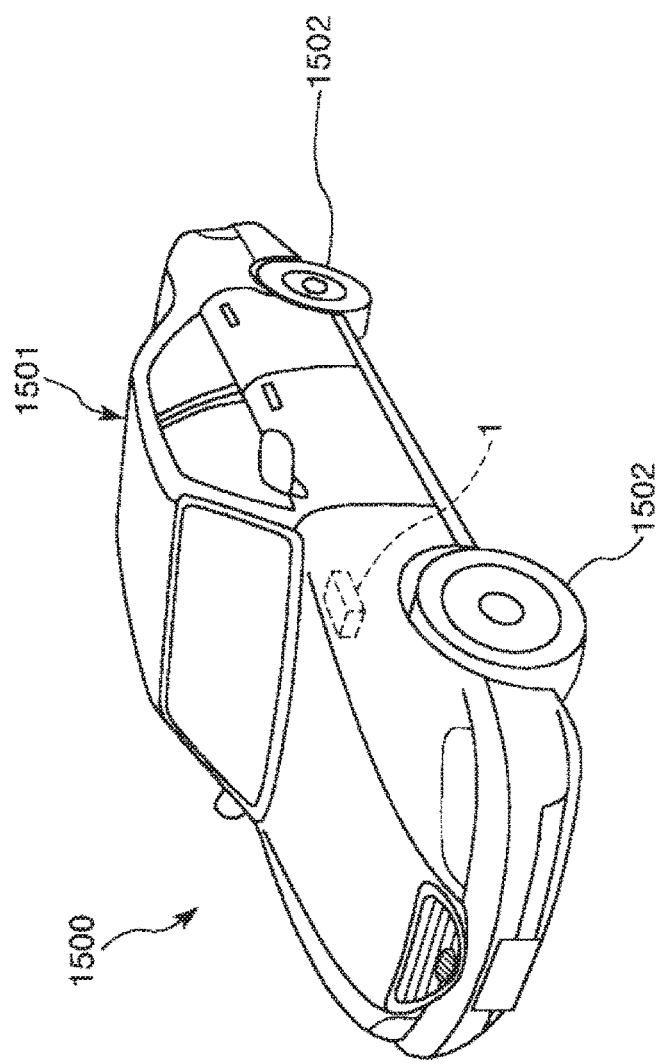
FIG. 12 is a diagram showing an example of a moving object according to the invention.

FIG. 12 is a diagram showing an example of the moving object according to the invention.

In the drawing, the moving object 1500 has a vehicle body 1501, and four wheels 1502, and is configured to rotate the wheels 1502 by a power source (an engine) not shown provided to the vehicle body 1501. Such a moving object 1500 incorporates the atomic oscillator 1.

It should be noted that, the electronic apparatus according to the invention is not limited to those described above, and as the electronic apparatus according to the invention, there can be cited, for example, a cellular phone, a smartphone, a tablet terminal, a timepiece, a digital still camera, an inkjet ejection device (e.g., an inkjet printer), a personal computer (a mobile personal computer and a laptop personal computer), a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), a flight simulator, digital terrestrial broadcasting equipment, a cellular phone base station, and a GPS module.

Although the atom cell, the method of manufacturing the atom cell, the quantum interference device, the atomic oscillator, the electronic apparatus, and the moving object according to the invention are hereinabove described based on the embodiments shown in the accompanying drawings, the invention is not limited to the embodiments.

Further, the configuration of each of the sections according to the invention can be replaced with an arbitrary configuration having substantially the same function, and further, it is also possible to add an arbitrary constituent.

Further, the invention can be a combination of any of configurations in each of the embodiments described above.

Further, although in the embodiments described above, there is described, as an example, the case of using the atom cell according to the invention for the quantum interference device for making cesium or the like develop the resonance transition using coherent population trapping by two types of light different in wavelength from each other, the atom cell according to the invention is not limited to this example, but can also be used for a double resonance device for making rubidium or the like develop the resonance transition using a double resonance phenomenon due to light and microwave.

What is claimed is:

1. An atom cell comprising:
   alkali metal atoms;
   an alkali metal emission material configured to emit the alkali metal atoms; and
   an internal space housing the alkali metal atoms and the alkali metal emission material,
   wherein the internal space includes
      a first region housing the alkali metal atoms in a gas state,
      a second region housing the alkali metal emission material, and
      a third region housing the alkali metal atoms in one of a liquid state and a solid state, and
   the first region is located between the second region and the third region.

2. The atom cell according to claim 1, further comprising:
   a communication hole communicating the first region and the second region with each other,
   wherein a width of the communication hole is smaller than a width of the alkali metal emission material.

3. The atom cell according to claim 1, further comprising:
   a getter material disposed in the second region in addition to the alkali metal emission material,
   wherein the getter material absorbs a gas other than an alkali metal gas.

4. The atom cell according to claim 1, wherein
   partial pressure of a gas other than the gaseous alkali metal atoms in the internal space is equal to or lower than $10^{-4}$ Pa.

5. A method of manufacturing an atom cell, the method comprising:
   preparing a cell container having an internal space including a first region, a second region, and a third region, a solid compound including alkali metal being housed in the second region of the internal space;
   heating the second region to emit the alkali metal from the compound so that gaseous alkali metal atoms are in the internal space; and
   adjusting a temperature of the third region to a level lower than a temperature of the first region,
   wherein partial pressure of a gas other than the gaseous alkali metal atoms in the internal space is equal to or lower than $10^{-4}$ Pa.

6. The method of manufacturing an atom cell according to claim 5, wherein
   the preparing includes sealing the internal space.

7. The method of manufacturing an atom cell according to claim 5, further comprising:
   removing the second region after the heating for emitting.

8. The method of manufacturing an atom cell according to claim 7, wherein
   the removing is performed after the adjusting.

9. The method of manufacturing an atom cell according to claim 7, wherein
   in the preparing, the first region and the second region are communicated with each other via a communication hole, and
   the removing includes blocking the communication hole.

10. The method of manufacturing an atom cell according to claim 5, wherein
    in the preparing, a plurality of the cell containers is connected to one another.

11. A quantum interference device comprising:
    the atom cell according to claim 1; and
    a light source that emits light to the atom cell.

12. The quantum interference device according to claim 11, wherein
    the first region is higher in temperature than the third region.

13. An atomic oscillator comprising:
    the atom cell according to claim 1;
    a light source that emits light to the atom cell; and
    a light detector that receives light which passes through the atomic cell.

14. An electronic apparatus comprising:
    the atom cell according to claim 1; and
    a signal receiver that receive a signal form an external device,
    wherein the atom cell is located in the signal receiver.

15. A moving object comprising:
    the atom cell according to claim 1; and
    a movable body that houses the atom cell.

16. An atom cell comprising:
    alkali metal atoms;
    an alkali metal emission material configured to emit the alkali metal atoms; and
    an internal space housing the alkali metal atoms and the alkali metal emission material,
    wherein the internal space includes:
       a first region housing the alkali metal atoms in a gas state;
       a second region housing the alkali metal emission material; and
       a third region housing the alkali metal atoms in one of a liquid state and a solid state, and
    partial pressure of a gas other than the gaseous alkali metal atoms in the internal space is equal to or lower than $10^{-4}$ Pa.

17. A quantum interference device comprising:
    the atom cell according to claim 16; and
    a light source that emits light to the atom cell.

18. An atomic oscillator comprising:
    the atom cell according to claim 16;
    a light source that emits light to the atom cell; and a light detector that receives light which passes through the atomic cell.

19. An electronic apparatus comprising:
the atom cell according to claim 16; and
a signal receiver that receive a signal form an external device,
wherein the atom cell is located in the signal receiver.

20. The atom cell according to claim 16,
wherein the third region is located between the first region and the second region.

21. The atom cell according to claim 16,
wherein the first region is located between the second region and the third region.

22. A moving object comprising:
the atom cell according to claim 16; and
a movable body that houses the atom cell.

* * * * *